(12) United States Patent
Higashitani et al.

(10) Patent No.: US 11,590,821 B2
(45) Date of Patent: Feb. 28, 2023

(54) TEMPERATURE ADJUSTING APPARATUS

(71) Applicant: DENSO CORPORATION, Kariya (JP)

(72) Inventors: Mitsuharu Higashitani, Kariya (JP); Noriaki Ikemoto, Kariya (JP); Tomomi Hase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/274,719

(22) Filed: Feb. 13, 2019

(65) Prior Publication Data

US 2019/0248208 A1 Aug. 15, 2019

(30) Foreign Application Priority Data

Feb. 14, 2018 (JP) .............................. JP2018-024063

(51) Int. Cl.
*B60H 1/00* (2006.01)
*E05F 15/71* (2015.01)
(Continued)

(52) U.S. Cl.
CPC ....... *B60H 1/00742* (2013.01); *B60H 1/0073* (2019.05); *B60H 1/0075* (2013.01);
(Continued)

(58) Field of Classification Search
CPC .............. B60H 1/0073; B60H 1/00742; B60H 1/0075; B60H 1/00785; B60H 1/00964;
(Continued)

(56) References Cited

U.S. PATENT DOCUMENTS

| 5,145,112 A * | 9/1992 | Ueda ................. | B60H 1/00742 236/49.3 |
| 2009/0031741 A1* | 2/2009 | Hara ................. | B60H 1/00735 62/239 |

(Continued)

FOREIGN PATENT DOCUMENTS

| JP | S62-074760 A | 4/1987 |
| JP | H07-063392 A | 3/1995 |

(Continued)

*Primary Examiner* — Eric S Ruppert
*Assistant Examiner* — Hans R Weiland
(74) *Attorney, Agent, or Firm* — Oliff PLC

(57) ABSTRACT

A temperature adjusting apparatus is provided in a vehicle capable of performing an automatic driving. The temperature adjusting apparatus includes: an automatic driving determination unit that determines whether or not an automatic driving control is operating in the vehicle; a cabin temperature acquiring unit that acquires a cabin temperature in a vehicle cabin of the vehicle; and a cabin temperature adjusting unit that adjusts the cabin temperature. The cabin temperature adjusting unit is configured to control, when the automatic driving determination unit determines that the automatic driving control is operating in the vehicle and the cabin temperature acquired by the cabin temperature acquiring unit exceeds a predetermined range, temperature adjusting means provided in the vehicle, thereby executing a temperature adjusting control to adjust the cabin temperature.

8 Claims, 11 Drawing Sheets

(51) Int. Cl.
*G01R 19/165* (2006.01)
*E05F 15/695* (2015.01)
*B60W 10/04* (2006.01)

(52) U.S. Cl.
CPC ..... *B60H 1/00785* (2013.01); *B60H 1/00964* (2013.01); *B60W 10/04* (2013.01); *E05F 15/695* (2015.01); *E05F 15/71* (2015.01); *G01R 19/16542* (2013.01); *B60W 2540/10* (2013.01); *B60W 2540/12* (2013.01); *B60W 2540/18* (2013.01); *E05Y 2900/55* (2013.01)

(58) Field of Classification Search
CPC ............. B60W 10/30; B60W 60/0013; B60W 60/0023; E05F 15/695; E05F 15/71; G05D 1/0061; G05D 1/0217
See application file for complete search history.

(56) References Cited

U.S. PATENT DOCUMENTS

| | | | |
|---|---|---|---|
| 2009/0055046 A1* | 2/2009 | Harumoto | B60H 1/00771 701/36 |
| 2009/0320713 A1* | 12/2009 | Amiri | B61D 1/04 280/1 |
| 2013/0144470 A1* | 6/2013 | Ricci | G06F 16/24 701/2 |
| 2016/0018832 A1* | 1/2016 | Frank | F24F 11/62 700/276 |
| 2016/0339915 A1 | 11/2016 | Kuwahara et al. | |
| 2017/0132334 A1* | 5/2017 | Levinson | G06F 30/20 |
| 2017/0352267 A1* | 12/2017 | Tzirkel-Hancock | B60K 35/00 |
| 2018/0001734 A1* | 1/2018 | Faust | B60H 1/00842 |
| 2018/0208211 A1* | 7/2018 | Chiba | B60W 50/08 |
| 2018/0266834 A1* | 9/2018 | Cronin | B60H 1/00357 |
| 2018/0275666 A1* | 9/2018 | Nakajima | B60L 53/14 |
| 2018/0370324 A1* | 12/2018 | Zhou | B60H 1/00885 |
| 2019/0004513 A1* | 1/2019 | Chiba | G08G 1/096725 |
| 2019/0009641 A1* | 1/2019 | Jackson | B60H 1/00764 |
| 2019/0126766 A1* | 5/2019 | Taguchi | G06Q 10/0631 |
| 2019/0225189 A1* | 7/2019 | Maeda | B60H 1/00785 |
| 2019/0351737 A1* | 11/2019 | Hashimoto | B60H 1/00764 |
| 2019/0381864 A1* | 12/2019 | Watanabe | B60K 11/04 |
| 2020/0383580 A1* | 12/2020 | Shouldice | A61B 5/1102 |

FOREIGN PATENT DOCUMENTS

| | | |
|---|---|---|
| JP | H08-310228 A | 11/1996 |
| JP | H09-210702 A | 8/1997 |
| JP | 2001-001787 A | 1/2001 |
| JP | 2002-063668 A | 2/2002 |
| JP | 2006-240438 A | 9/2006 |
| WO | 2014/014862 A2 | 1/2014 |
| WO | 2014/109103 A1 | 7/2014 |

\* cited by examiner

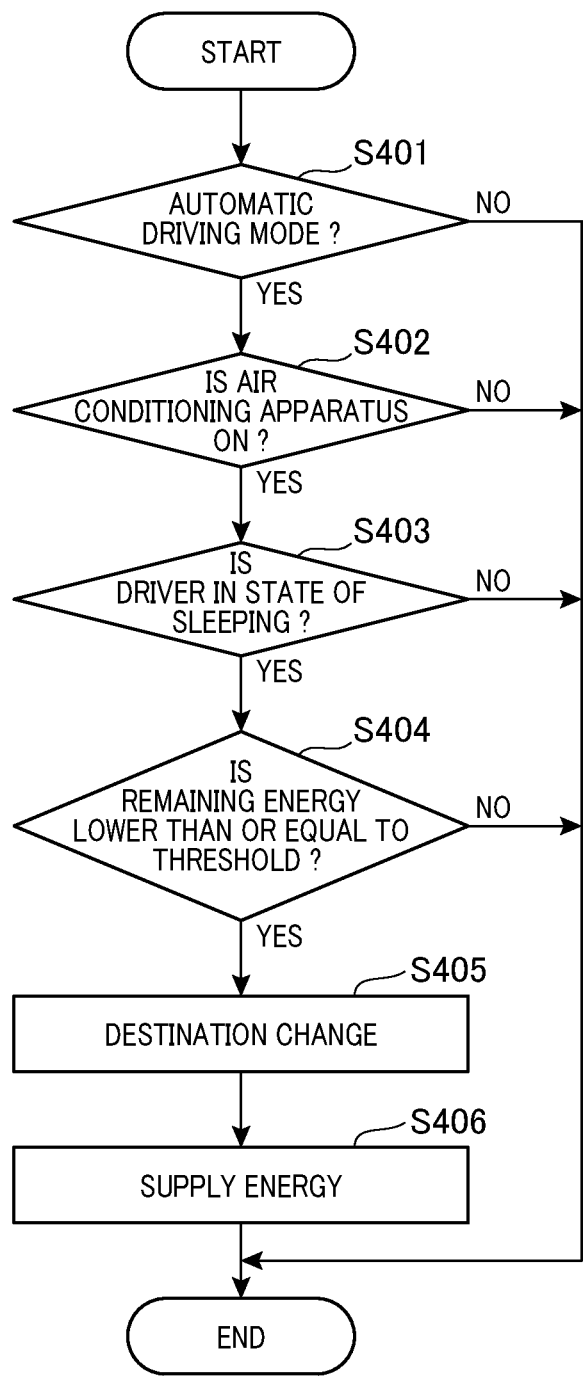

TEMPERATURE ADJUSTING APPARATUS

CROSS-REFERENCE TO RELATED APPLICATION

This application is based on and claims the benefit of priority from earlier Japanese Patent Application No. 2018-24063 filed Feb. 14, 2018, the description of which is incorporated herein by reference.

BACKGROUND

Technical Field

The present disclosure relates to a temperature adjusting apparatus provided in a vehicle capable of performing an automatic driving.

Description of the Related Art

As an automatic driving technique of adapting for a travel environment, a following technique is disclosed. In the technique, while an intervention operation such as accelerator operation, braking operation or steering operation by the driver is performed during an automatic driving operation, a target value for a driving force, a braking force and a steering angle are determined based on the intervention operation, and any one of the travelling speed, the intervehicle distance, the acceleration factor, the travelling line and the like is detected. Then, the control parameter set in advance including the traveling speed, the intervehicle distance, the acceleration factor and the travelling line is corrected so as to minimize a deviation relative to the values detected when the intervention operation is performed.

SUMMARY

The present disclosure provides a temperature adjusting apparatus including: an automatic driving determination unit that determines whether or not an automatic driving control is operating in the vehicle; a cabin temperature acquiring unit that acquires a cabin temperature in a vehicle cabin of the vehicle; and a cabin temperature adjusting unit that adjusts the cabin temperature.

BRIEF DESCRIPTION OF THE DRAWINGS

In the accompanying drawings:

FIG. 12 is a flowchart illustrating an operation of the temperature adjusting ECU.

DETAILED DESCRIPTION OF THE PREFERRED EMBODIMENTS

Hereinafter, with reference to the drawings, an embodiment of the present disclosure will be described. Note that the same reference numbers are applied to the same elements in each drawing as much as possible in order to readily understand the embodiment.

Figure 1:
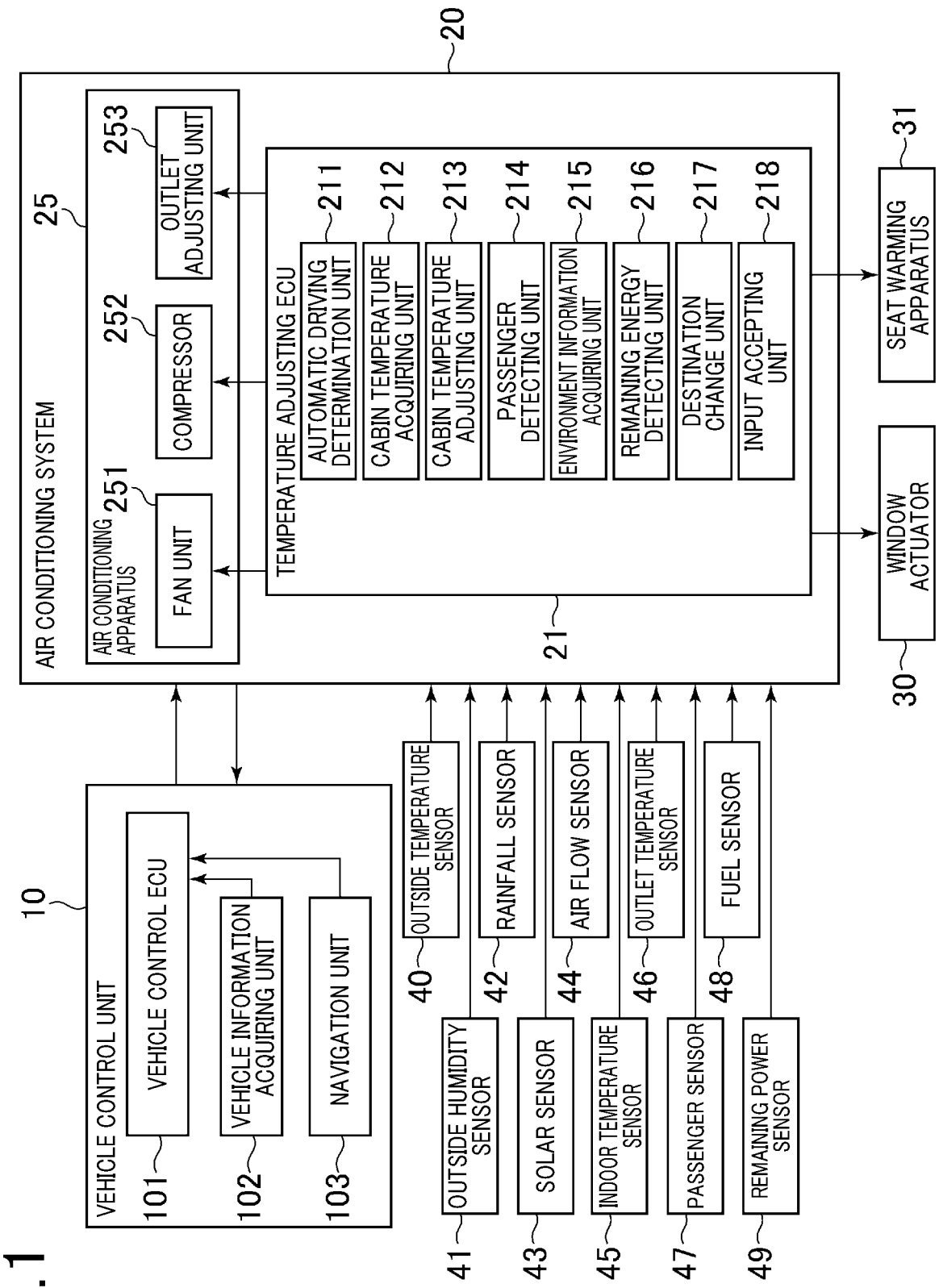
FIG. 1 is a block diagram showing a configuration of an embodiment including a temperature adjusting ECU according to the present disclosure.

With reference to FIG. 1, a temperature adjusting ECU (electronic control unit) 21 according to the embodiment will be described. The temperature adjusting ECU 21 is provided in the air conditioning system 20. The air conditioning system 20 is mounted on a vehicle capable of performing an automatic driving operation and performs an air conditioning in the vehicle cabin.

The air conditioning system 20 is provided with a temperature adjusting ECU 21 and an air conditioning apparatus 25. The air conditioning apparatus 25 includes a fan unit 251, a compressor 252 and an outlet adjusting unit 253. The compressor 252 constitutes a refrigeration cycle. The fan unit 251 blows air to the evaporator and a heater core which constitute the refrigeration cycle to perform cooling or heating. Alternatively, without driving the refrigerator cycle, by driving only the fan unit 251, circulation air can be supplied to the vehicle cabin while reducing the power consumption. The outlet adjusting unit 253 is able to adjust a direction of air flowing into the vehicle cabin or to switch the circulation between interior-air recirculation and fresh-air exchange.

The air conditioning system 20 is configured to be mutually communicable with the vehicle control unit 10. The vehicle control unit 10 is provided with a vehicle control ECU 101, a vehicle information acquiring unit 102 and a navigation unit 103. The vehicle control ECU 101 is mounted on a vehicle and controls an overall driving operation of the vehicle including a start operation, an acceleration operation, a deceleration operation, stop operation, and a steering operation of the vehicle.

A vehicle information acquiring unit 102 acquires travelling speed information including information indicating the travelling speed of the vehicle and information related to the travelling speed, and information about yaw angle and pitch angle. The vehicle information acquiring unit 102 outputs the acquired information to the vehicle control ECU 101. The vehicle control ECU 101 transmits the vehicle information to the temperature adjusting ECU 21.

The navigation unit 103 identifies the location of the own vehicle and compares the identified location of the own vehicle with the map, thereby identifying the location of the own vehicle on the map. The navigation unit 103 acquires positional information used for identifying the location of the vehicle based on the GPS signal received by the GPS antenna, and signals indicating vehicle's behavior outputted by the vehicle speed sensor, the acceleration sensor, and the gyro sensor and the like.

The navigation unit 103 also serves as an apparatus that guides the own vehicle to the destination based on the identified location of the own vehicle. The navigation unit 103 outputs the acquired positional information and guidance information.

In addition to the data transmitted by the vehicle control ECU 101, the temperature adjusting ECU 21 accepts various data outputted by an outside temperature sensor 40, an outside humidity sensor 41, a rainfall sensor 42, a solar sensor 43, an air flow sensor 44, an indoor temperature sensor 45, an outlet temperature sensor 46, a passenger sensor 47, a fuel sensor 48, and a remaining power sensor 49.

The outside temperature sensor 40 detects temperature outside the vehicle and outputs the detected temperature as the outside temperature data to the temperature adjusting ECU 21. The outside humidity sensor 41 detects the humidity outside the vehicle and outputs the detected humidity as the outside humidity data to the temperature adjusting ECU 21.

The rainfall sensor 42 detects rainfall onto the vehicle and outputs the detected rainfall as the rainfall data to the temperature adjusting ECU 21. The solar sensor 43 detects an amount of solar radiation incident on the vehicle and outputs it as the amount of solar radiation data to the temperature adjusting ECU 21.

The air flow sensor 44 detects the air flow data indicating an amount of air flow in the vicinity of the vehicle and outputs the air flow data to the temperature adjusting ECU 21. The indoor temperature sensor 45 detects the temperature inside the vehicle cabin and outputs the detected temperature as the cabin temperature data to the temperature adjusting ECU 21.

The outlet temperature sensor 46 serves as a temperature sensor provided in the outlet that blows air-conditioning air into the vehicle cabin. The outlet temperature sensor 46 detects the temperature of the outlet and outputs the detected temperature as the outlet temperature data to the temperature adjusting ECU 21.

The passenger sensor 47 detects whether or not a passenger is present in the vehicle and outputs the detection result as a passenger data to the temperature adjusting ECU 21. The passenger sensor 47 may detect whether or not a passenger is on board in the vehicle by detecting a change in weight. The passenger sensor 47 may detect that the passenger is sitting on the seat based on a temperature distribution in the vehicle cabin. Also, an in-vehicle camera may be used to detect a passenger by using image recognition.

The fuel sensor 48 detects fuel data indicating a remaining fuel capacity of the vehicle and outputs the detected remaining fuel capacity to the temperature adjusting ECU 21. The remaining power sensor 49 detects a remaining power of the battery mounted on the vehicle and outputs the detected remaining power as the remaining power data to the temperature adjusting ECU 21.

The temperature adjusting ECU 21 operates, based on the outside temperature data, the rainfall data, the amount of solar radiation data, the air flow data, the cabin temperature data, the outlet temperature data, the passenger data, the fuel data and the remaining power data, the rainfall data the fan unit 251, the compressor 252, and the outlet adjusting unit 253, together with a window actuator 30 and a seat warming apparatus 31.

The window actuator 30 opens/closes the windows of the vehicle. A plurality of windows which are capable of being opened or closed in the vehicle are present depending on seat arrangement. The plurality of windows includes left-right windows of the front seats, left-right windows of the rear seats and a rear window. The window actuator 30 can control an electronic shade to adjust the amount of solar radiation entering into the vehicle cabin. The seat warming apparatus 31 is able to warm or cool the seat where the passenger is sitting using a seat heater and a seat cooler.

The temperature adjusting ECU 21 is configured of a computer as a hardware element including an arithmetic unit as a CPU, a memory unit such as RAM or RAM, and an interface unit for receiving and transmitting data. Subsequently, functional elements of the temperature adjusting ECU 21 will be described.

The temperature adjusting ECU 21 includes, as functional elements, an automatic driving determination unit 211, a cabin temperature acquiring unit 212, a cabin temperature adjusting unit 213, a passenger detecting unit 214, an environment information acquiring unit 215, a remaining energy detecting unit 216, a destination change unit 217 and an input accepting unit 218.

The automatic driving determination unit 211 determines whether or not an automatic driving control is operating in the vehicle. The automatic driving determination unit 21 determines whether an automatic driving control is executing based on information outputted by the vehicle control ECU 101.

The cabin temperature acquiring unit 212 acquires the temperature in the vehicle cabin as a cabin temperature. The cabin temperature acquiring unit 212 detects the cabin temperature in the vehicle cabin based on the cabin temperature data.

The cabin temperature adjusting unit 213 adjusts the cabin temperature in the vehicle cabin. The cabin temperature adjusting unit 213 drives the refrigeration cycle including the compressor 252 and the fan unit 251, thereby performing the air conditioning of the vehicle cabin. Further, the cabin temperature adjusting unit 213 drives the outlet adjusting unit 253 to acquire outside air or adjust an air direction of the air conditioning air. The cabin temperature adjusting unit 213 drives the window actuator 30 to open/close the windows of the vehicle, thereby exchanging air between the outside and the inside the vehicle cabin, or controls the electronic shade to adjust the amount of solar radiation entering the vehicle cabin. Moreover, the cabin temperature adjusting unit 213 drives the seat warming apparatus 31 to heat or cool the seat.

The passenger detecting unit 214 detects whether a passenger is present or not in the vehicle. The passenger detecting unit 214 detects a state of presence of a passenger in the vehicle. The passenger data does not show that boarding of the passenger into the vehicle, the passenger detecting unit 214 determines that no passengers are on board.

The environment information acquiring unit 215 acquires environment information around the vehicle. The environment information acquiring unit 215 acquires the environment information including a temperature, a humidity, an amount of solar radiation, an amount of air flow, an amount of rainfall, the season and at least one of these predicted values. The environment information acquiring unit 215 is able to acquire the temperature around the vehicle based on the outside temperature data. The environment information acquiring unit 215 acquires the amount of solar radiation around the vehicle based on the solar radiation data. The environment information acquiring unit 215 acquires the amount of air flow around the vehicle based on the air flow data. The environment information acquiring unit 215 acquires an amount of rainfall around the vehicle based on the rainfall data. The environment information acquiring unit 215 acquires season information around the vehicle based on a counter in the vehicle or calendar information obtained by communication with an external equipment.

The environment information acquiring unit 215 acquires environment information around the vehicle based on the positional information. The environment information acquiring unit 215 is able to acquire environment information corresponding to the positional information from an environment information server.

The remaining energy detecting unit 216 detects remaining energy for driving the temperature adjusting means. According to the present embodiment, as the temperature adjusting means, the air conditioning apparatus 25, the window actuator 30 and the seat warming apparatus 31 are provided. However, various apparatuses may be utilized as long as the temperature in the vehicle cabin and the sensible temperature of the passenger can be adjusted. As the remaining energy, remaining battery capacity which supplies power to drive the temperature adjusting means may be stored.

The destination change unit 217 is used to change the destination of the vehicle. The destination change unit 217 requires to set the destination of the vehicle to be a location where energy can be supplied to the vehicle, when the remaining energy detected by the remaining energy detection unit is less than or equal to a threshold. Specifically, the destination change unit 217 transmits a destination change request to the navigation unit 103. The navigation unit 103 changes the destination based on the destination change request.

As described, the temperature adjusting ECU 21 is provided in a vehicle capable of performing automatic driving. The temperature adjusting ECU 21 includes an automatic driving determination unit 211 that determines whether the automatic driving control is executed in the vehicle, a cabin temperature acquiring unit 212 that acquires a temperature in the vehicle cabin, and a cabin temperature adjusting unit 213 that adjusts the temperature in the vehicle cabin. In the case where the determination result of the automatic driving determination unit 211 is that the automatic driving control is operating in the vehicle and the cabin temperature acquired by the cabin temperature acquiring unit 212 exceeds a predetermined range, the cabin temperature adjusting unit 213 controls the temperature adjusting means provided in the vehicle, thereby executing the temperature adjusting control to adjust the temperature in the vehicle cabin.

According to the present embodiment, when the automatic driving control is executing in the vehicle capable of executing the automatic driving and the temperature in the vehicle cabin exceeds a predetermined range, the temperature of the vehicle can be adjusted. Hence, even in a case of an automatic-driving specific situation where the automatic driving control is executing and a passenger is unable to adjust the temperature in the vehicle cabin because the passenger is sleeping for example, passenger's comfort can be ensured.

According to the present embodiment, the cabin temperature adjusting unit 213 controls the air conditioning apparatus 25 as the temperature adjusting means provided in the vehicle, thereby executing the temperature adjusting control.

The cabin temperature adjusting unit 213 controls the air conditioning apparatus 25 to execute the temperature adjusting control, whereby the passenger's comfort can be ensured even when the temperature in the vehicle cabin significantly varies.

According to the present embodiment, the cabin temperature adjusting unit 213 changes the state of the air conditioning apparatus 25 to be an activation state from a stop state, or to be the stop state from the activation state, thereby executing or stopping the temperature adjusting control.

Since the state of the air conditioning apparatus 25 can be changed to the activation state from the stop state, even when the air conditioning apparatus 25 has not been activated from the initial state, the temperature adjusting control can be executed. Since the state of the air conditioning apparatus 25 can be changed to the Off state from the On state, the air conditioning apparatus 25 can be stopped when the temperature adjusting control is terminated. Hence, without activating the air conditioning apparatus 25 over the entire period where the automatic driving control is executed, by executing the temperature adjusting control, the passenger's comfort can be ensured, and the air conditioning apparatus 25 is controlled to be stopped when execution of the temperature adjusting control is not required, thereby improving the fuel consumption efficiency, and the power consumption efficiency can be improved.

In the present embodiment, the predetermined range is determined by a preset value based on a degree of discomfort or a user setting value.

Since the predetermined range is determined by setting the preset value based on the degree of discomfort or the user setting value, the temperature adjusting control can be executed such that the passenger feels more comfortable.

The temperature adjusting ECU 21 according to the present embodiment further includes a passenger detecting unit 214 that detects whether a passenger is present or not in the vehicle. When the passenger detecting unit 214 detects that the passenger is present in the vehicle, the cabin temperature adjusting unit 213 executes the temperature adjusting control.

Since the temperature adjusting control is executed when the passenger is present in the vehicle, for example, when the passenger is not present in the vehicle, the temperature adjusting control can be weakened or stooped. Accordingly, the fuel consumption efficiency and the power consumption efficiency can be improved while the passenger's comfort is ensured.

According to the present embodiment, the cabin temperature adjusting unit 213 executes the temperature adjusting control by acquiring the air outside the vehicle.

In the case where a desirable temperature zone is present between the air temperature inside the vehicle and the air temperature outside the vehicle, by executing a temperature adjusting control that acquires the air outside the vehicle into the vehicle cabin, equipment requiring relatively larger power consumption such as the compressor 252 included in the air conditioning apparatus 25 and the seat warming apparatus 31 are not necessary for the temperature adjusting control. Accordingly, the fuel consumption efficiency and the power consumption efficiency can be improved.

According to the present embodiment, the cabin temperature adjusting unit 213 opens/closes windows of the vehicle to execute the temperature adjusting control.

When the windows of the vehicle are opened/closed, the air inside or outside the vehicle can be efficiently exchanged. Further, compared to equipment that requires relatively larger power consumption such as the compressor 252 and the sear warming apparatus 31, the power consumption required for opening and closing the windows is low. Hence, the power consumption efficiency can be improved.

The temperature adjusting ECU 21 further includes an environment information acquiring unit 214 that acquires environment information around the vehicle. The cabin temperature adjusting unit 213 controls a plurality of types of temperature adjusting means based on the environment information to execute the temperature adjusting control.

When acquiring the environment information around the vehicle, the temperature trend in the vehicle cabin can be estimated. With the environment information, a temperature adjusting control depending on the estimated temperature trend of the vehicle cabin can be executed. The temperature adjusting means includes a plurality of types of means such as the air conditioning apparatus 25, the seat warming apparatus 31, and a window for exchanging the air. The cabin temperature adjusting unit 213 utilizes the environment information including temperature, humidity, amount of solar radiation, amount of air flow, amount of rainfall, and predicted values of these, and performs integral control appropriately using a plurality of temperature adjusting means to execute the temperature adjusting control. Hence, the passenger feels more comfortable in the vehicle.

As an example, when the temperature in the vehicle cabin is out of the allowable range and the temperature outside the vehicle is within an allowable range, the fan unit 251 and the outlet adjusting unit 253 as an outside air acquiring means may be controlled without using the compressor 272 of the air conditioning system, thereby performing the temperature adjusting control. Since the temperature adjusting can be performed without driving the compressor 252, the fuel consumption efficiency and the power consumption efficiency can be improved.

Focusing the exchange of the air, the window actuator 30 may be controlled to open or close so as to exchange the air between the outside air with the inside air. In the case where rainfall or snow falling affects an operation of opening/closing the window, the air conditioning apparatus 25 may perform the temperature adjusting control in accordance with this environment information, while the windows are controlled to be closed.

As another example, considering an amount of solar radiation, the temperature adjusting control can be performed. In the summer, when the amount of solar radiation is large, since sensible temperature of the passenger increases, the passenger may feel discomfort compared to the case where the amount of solar radiation is small, and so the air conditioning apparatus 25 may execute the temperature adjusting control earlier. On the other hand, when the amount of solar radiation is large in the winter, since an increase in the amount of solar radiation cause an increase of the sensible temperature of the passenger, comfort of the passenger is improved. In this regard, the temperature adjusting control by the air conditioning apparatus 25 can be stopped.

In the case where the vehicle is in an automatic driving operation, the passenger does not necessarily gaze around the vehicle. Hence, the window actuator 30 may be controlled such that the windows shield light entering the vehicle cabin by the electronic shade. In the winter, in addition to activating the air conditioning apparatus 25, the seat warming apparatus 31 may warm the seat.

According to the present embodiment, the environment information acquiring unit 215 acquires the environment information including temperature, humidity, amount of solar radiation, amount of air flow, amount of rainfall, the season and predicted values of at least one of these. The cabin temperature adjusting unit 213 performs the temperature adjusting control based on a preset value based on a degree of discomfort or a user setting value.

Since the environment information includes a temperature, a humidity, an amount of solar radiation, an amount of air flow, an amount of rainfall, the season and at least one of these predicted values, the temperature trend in the vehicle cabin can be estimated precisely. The temperature trend in the vehicle cabin is precisely estimated and the predetermined range is determined by setting the preset value based on the degree of discomfort or the user setting value, whereby the temperature adjusting control can be executed such that the passenger feels more comfortable.

The temperature adjusting ECU 21 further includes a remaining energy detecting unit 216 that detects remaining energy for driving the temperature adjusting means. The cabin temperature adjusting unit 213 restricts the output of the temperature adjusting means when the remaining energy detected by the remaining energy detecting unit 216 is less than or equal to a threshold.

Compared to a case where the remaining energy is larger than the threshold, the air conditioning system restricts the output of the temperature adjusting means such as the compressor 252 of the air conditioning apparatus 25 and the seat warmer apparatus 31 in which the energy is significantly consumed, when the remaining energy is less than or equal to the threshold. Hence, the temperature adjusting means can be driven for longer period, whereby the passenger is able to feel comfortable for a longer period.

The temperature adjusting ECU 21 according to the present embodiment further includes the destination change unit 217 used to change the destination of the vehicle. The destination change unit 217 requires a change of the destination of the vehicle to be a location where the energy can be supplied to the vehicle, when the remaining energy detected by the remaining energy detecting unit 216 is less than or equal to the threshold.

When the remaining energy is less than or equal to the threshold, the destination of the vehicle is set to a location where energy can be supplied to the vehicle, whereby energy can be supplied to the vehicle before exhausting the energy for driving the temperature adjusting means such as the air conditioning apparatus 25 or the seat warming apparatus 31 which have a large energy consumption. As a result, the temperature can be set without disturbing the comfort of the passenger, and the vehicle can continue to travel.

Figure 2:
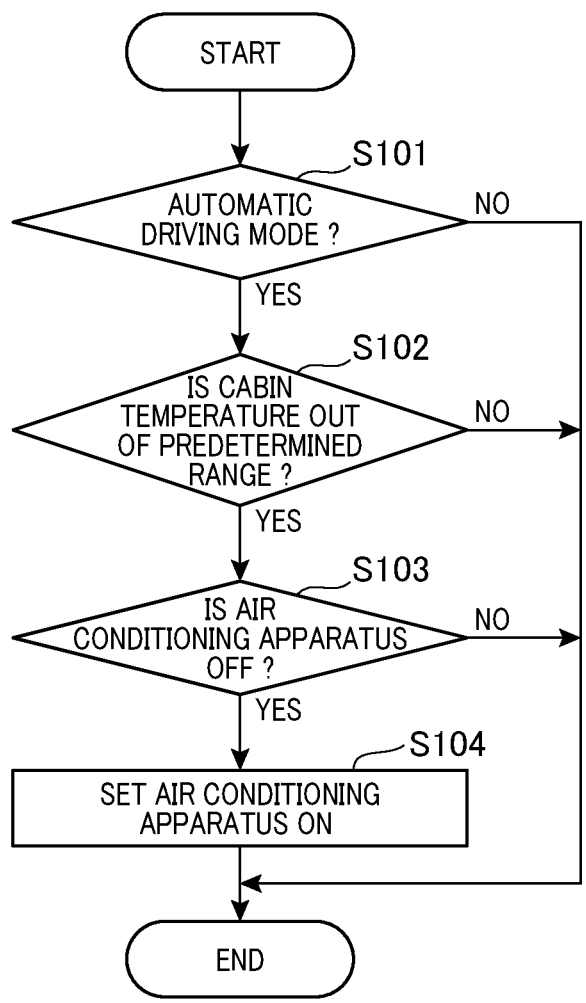
FIG. 2 is a flowchart illustrating an operation of the temperature adjusting ECU.

Subsequently, referring to FIG. 2, control contents of the temperature adjusting ECU will be described. At step S101, the automatic driving determination unit 211 determines whether the vehicle is in an automatic driving mode. Note that being in an automatic driving mode refers to a case where the automatic driving mode has been selected in a vehicle capable of selecting a manual driving mode or the automatic driving mode. As long as the automatic driving mode has been selected, even if the vehicle is stopped after arriving the destination with the automatic driving mode, it is also referred to as "being in an automatic driving mode". When the determination result is in an automatic driving mode, the process proceeds to step S102, and terminates the procedure when it is not in the automatic driving mode.

At step S102, the cabin temperature adjusting unit 213 determines whether the temperature in the vehicle cabin (i.e. cabin temperature) is out of a predetermined range. For the predetermined range, a value used in an experiment based on a degree of discomfort such as heat or cold may be set as a preset value or a user setting value may be used. Alternatively, upper and lower limit values may be set such that temperatures causing life crisis other than sense of discomfort, such as 35 degrees C. in the summer and 0 degrees C. in the winter may be set as the upper and lower limits. When the temperature in the vehicle cabin is out of the predetermined range, the process proceeds to step S103, and terminates the procedure when the temperature in the vehicle cabin is not out of the predetermined range.

At step S103, the cabin temperature adjusting unit 213 determines whether the air conditioning apparatus 25 is OFF. When the air conditioning apparatus 25 is OFF, the process proceeds to step S104. When the air conditioning apparatus 25 is not OFF, the process terminates the procedure.

At step S104, the cabin temperature adjusting unit 213 activates the air conditioning apparatus 25. In this case, the air conditioning apparatus 25 may preferably be set in an automatic setting mode in which the temperature setting or the humidity setting are automatically set. The temperature setting may be 20 degrees C. or the user may set the temperature in advance. Moreover, the temperature setting may be changed depending on seasons. For example, the temperature may be set in the summer to be higher than that in the winter such that the temperature is set to 26 degrees C. in the summer, and the temperature is set to 20 degrees C. in the winter. In the summer, because of the high outside temperature, people dress lightly, and in the winter, people dress warmly because of the cold outside temperature. Hence, setting the temperature constant through year around, the passenger may feel cold in the summer and may feel hot in the winter. In this respect, changing the temperature depending on the seasons, passenger's comfort can be secured depending on the seasons and suitable clothing for each season.

Figure 3:
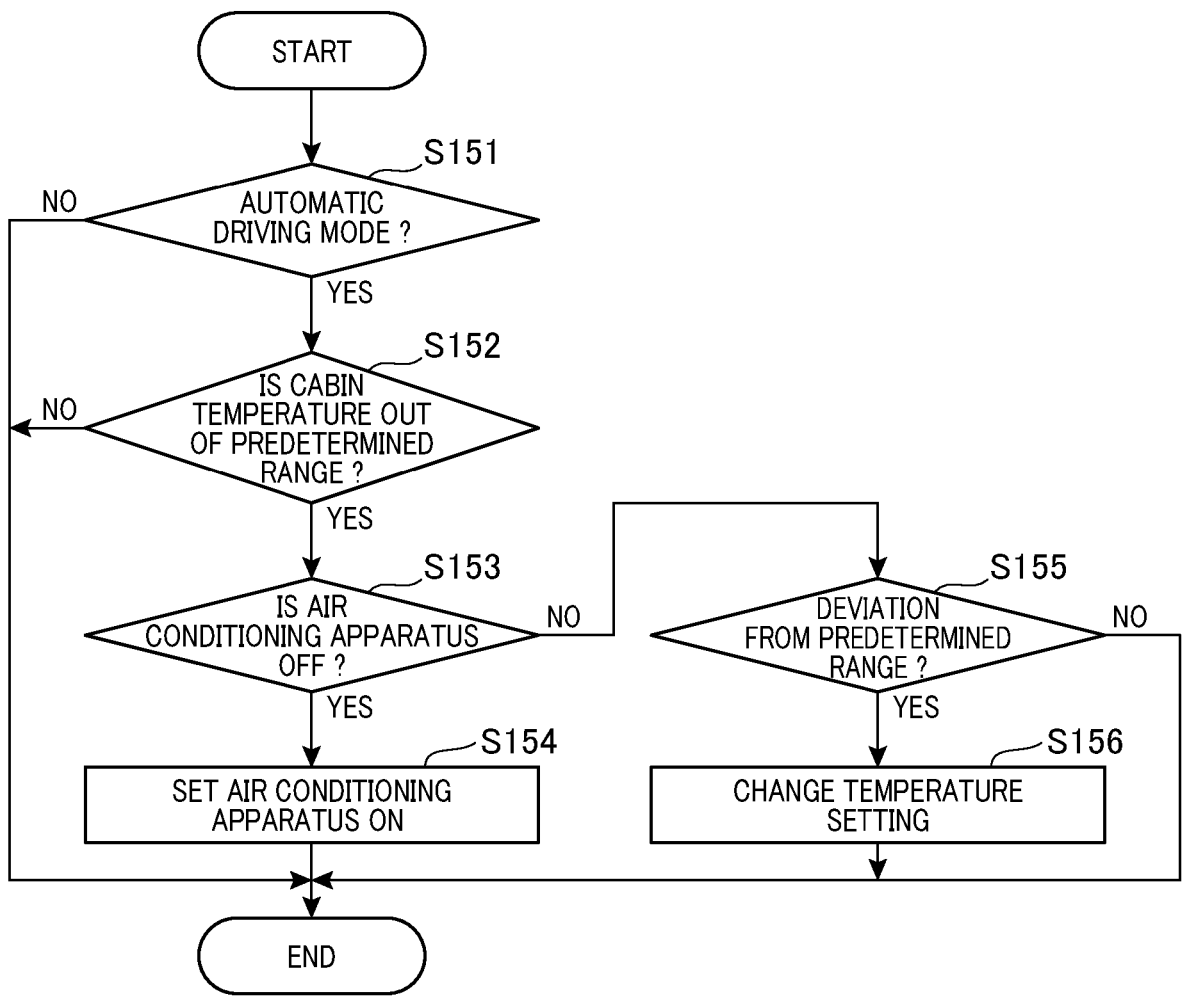
FIG. 3 is a flowchart illustrating an operation of the temperature adjusting ECU.

Subsequently, with reference to FIG. 3, control contents of the temperature adjusting ECU 21 will be described. At step S151, the automatic driving determination unit 211 determines whether the vehicle is in an automatic driving mode. When the vehicle is in an automatic driving mode, the process proceeds to step S152, and terminates the procedure when the vehicle is not in an automatic driving mode.

At step S152, the cabin temperature adjusting unit 213 determines whether the temperature in the vehicle cabin is out of the predetermined range. When the temperature in the vehicle cabin is out of the predetermined range, the process proceeds to step S153. When the temperature in the vehicle cabin is not out of the predetermined range, the process terminates the procedure.

At step S153, the cabin temperature adjusting unit 213 determines whether the air conditioning apparatus 25 is OFF. When the air conditioning apparatus 25 is OFF, the process proceeds to step 154, and when the air conditioning apparatus 25 is ON, the process proceeds to step S155.

At step S154, the cabin temperature adjusting unit 213 operates the air conditioning apparatus 25. At this moment, the air conditioning apparatus 25 may preferably be set in an automatic setting mode in which the temperature setting or the humidity setting are automatically set. The temperature setting may be 20 degrees C. or a user may set the temperature in advance.

Figure 4:
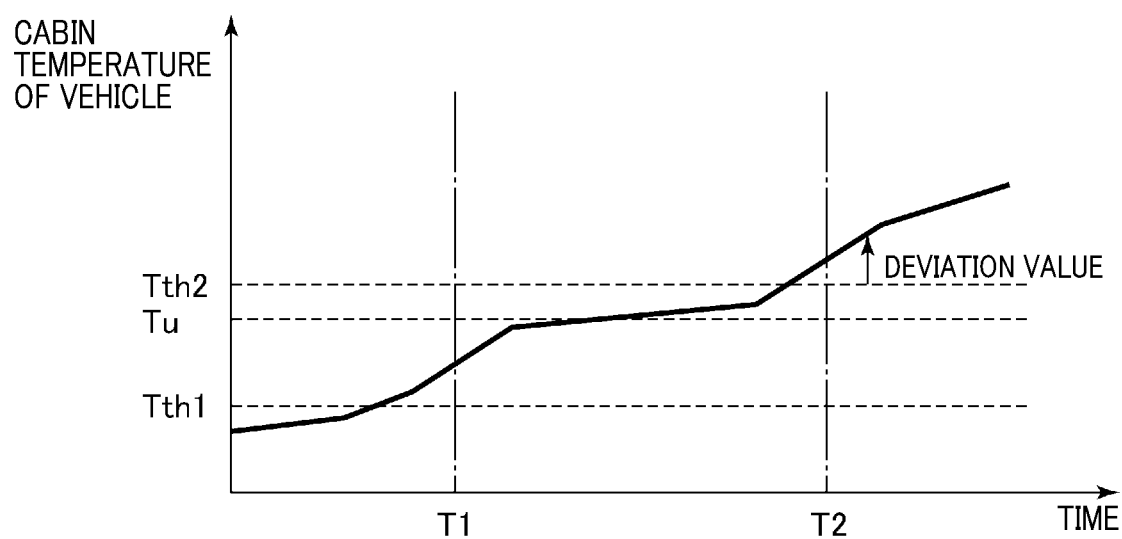
FIG. 4 is a graph explaining the flowchart shown in FIG. 3.

At step S155, the cabin temperature adjusting unit 213 determines whether a deviation in which the temperature in the vehicle cabin deviates from a predetermined range is larger than or equal to a threshold. FIG. 4 is a graph illustrating a relationship between the temperature in the cabin and the time. An example shown in FIG. 4 illustrates a case where a user sets the temperature at time T1. In this case, the user sets the temperature setting to be Tu. The cabin temperature adjusting unit 213 has been set to have a threshold temperature Tth1 as a lower limit of the predetermined range and a threshold temperature Tth2 as an upper limit of the predetermined range, with respect to the temperature setting Tu. At time T2, the temperature in the vehicle cabin exceeds the threshold Tth2 as the upper limit and is increasing. When a value deviated from the upper limit threshold Tth2 exceeds the predetermined value, the process determines that the deviation in which the temperature in the vehicle cabin deviate from a predetermined range is larger than or equal to the threshold. In FIG. 3, when determined that the deviation is larger than or equal to the threshold, the process proceeds to step S156, and terminates the procedure when determined that the deviation is less than the threshold.

At step S156, the cabin temperature adjusting unit 213 changes the temperature setting of the air conditioning apparatus 25. As an example, a case will be assumed in which the temperature setting has been set to 26 degrees C. when the temperature in the vehicle cabin is in a range from 18 degrees C. to 28 degrees C., but the temperature in the vehicle cabin becomes 35 degrees C. In this situation, the vehicle cabin was cool when the driver set the temperature for the vehicle cabin, then, due to strong solar radiation, performance of the air conditioning apparatus becomes insufficient to maintain the desired temperature setting. In this case, for example, the temperature setting is set to 24 degrees C., which is opposite to a deviation side.

However, immediately after the automatic driving is activated, since it is expected that a deviation between the setting temperature and the temperature in the vehicle cabin becomes larger, a process at step S156 may be masked for a few minutes after activating the automatic driving, or the temperature setting may be gradually changed. Thus, even in a case where the weather suddenly changes causing inappropriate temperature setting when the passenger is sleeping, the temperature can be automatically set appropriately. When the process of step S156 is completed, all of the processes are terminated.

Figure 5:
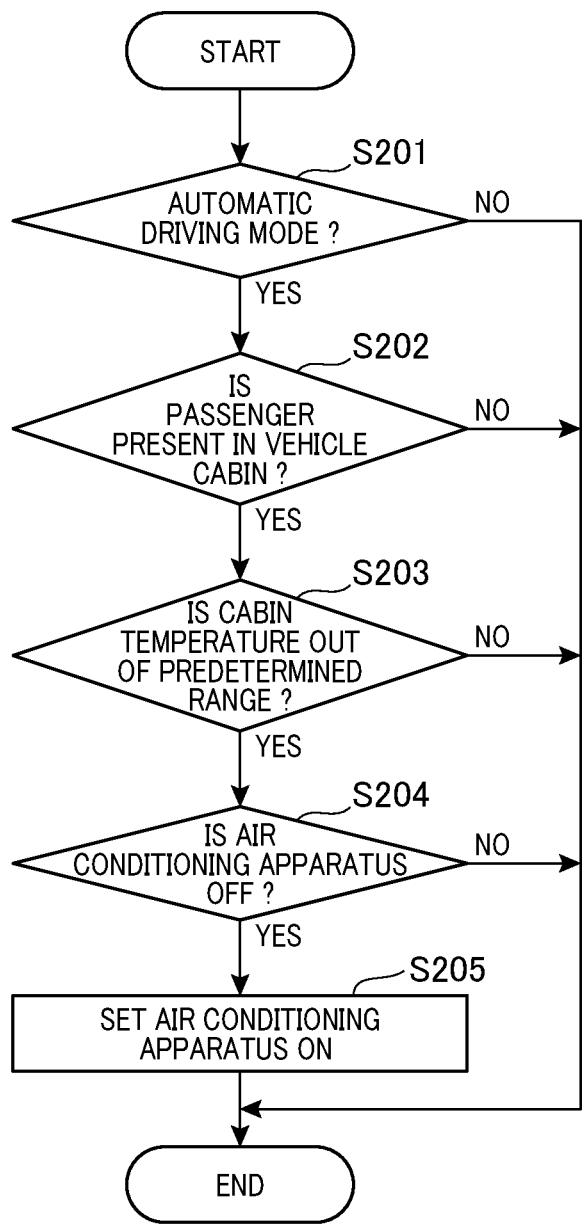
FIG. 5 is a flowchart illustrating an operation of the temperature adjusting ECU.

Subsequently, with reference to FIG. 5, control contents of the temperature adjusting ECU 21 will be described. At step S201, the automatic driving determination unit 211 determines whether the vehicle is in an automatic driving mode. When the vehicle is in an automatic driving mode, the process proceeds to step S202 and terminates the procedure when the vehicle is in an automatic driving mode.

At step S202, the passenger detecting unit 214 determines whether a passenger is present in the vehicle cabin. The presence of the passenger is determined based on passenger data detected by the passenger sensor 47. The passenger sensor 47 may detect the passenger seated on the seat by detecting a weight change on the seat, by detecting whether the seat belt is fastened or not, or based on a temperature distribution in accordance with a detection result of a thermo sensor. The process proceeds to step S203 when the passenger is present in the vehicle cabin, and terminates the procedure when no passenger is present in the vehicle cabin.

At step S203, the cabin temperature adjusting unit 213 determines whether the temperature of the vehicle cabin is out of the predetermined range or not. When the temperature in the vehicle cabin is out of the predetermined range, the process proceeds to step S204, and terminates the procedure when the temperature in the vehicle cabin is not out of the predetermined range.

At step S204, the cabin temperature adjusting unit 213 determines whether the air conditioning apparatus 25 is OFF. When the air conditioning apparatus 25 is OFF, the process proceeds to step S205. When the air conditioning apparatus 25 is ON, the process terminates the procedure.

At step S205, the cabin temperature adjusting unit 213 operates the air conditioning apparatus 25. In this case, the air conditioning apparatus 25 may preferably be set in an automatic setting mode in which the temperature setting or the humidity setting are automatically set. The temperature setting may be 20 degrees C. or a user may set the temperature. Also, when the passenger is present in the vehicle cabin and if the temperature is high, it is preferable to notify outside the vehicle.

Figure 6:
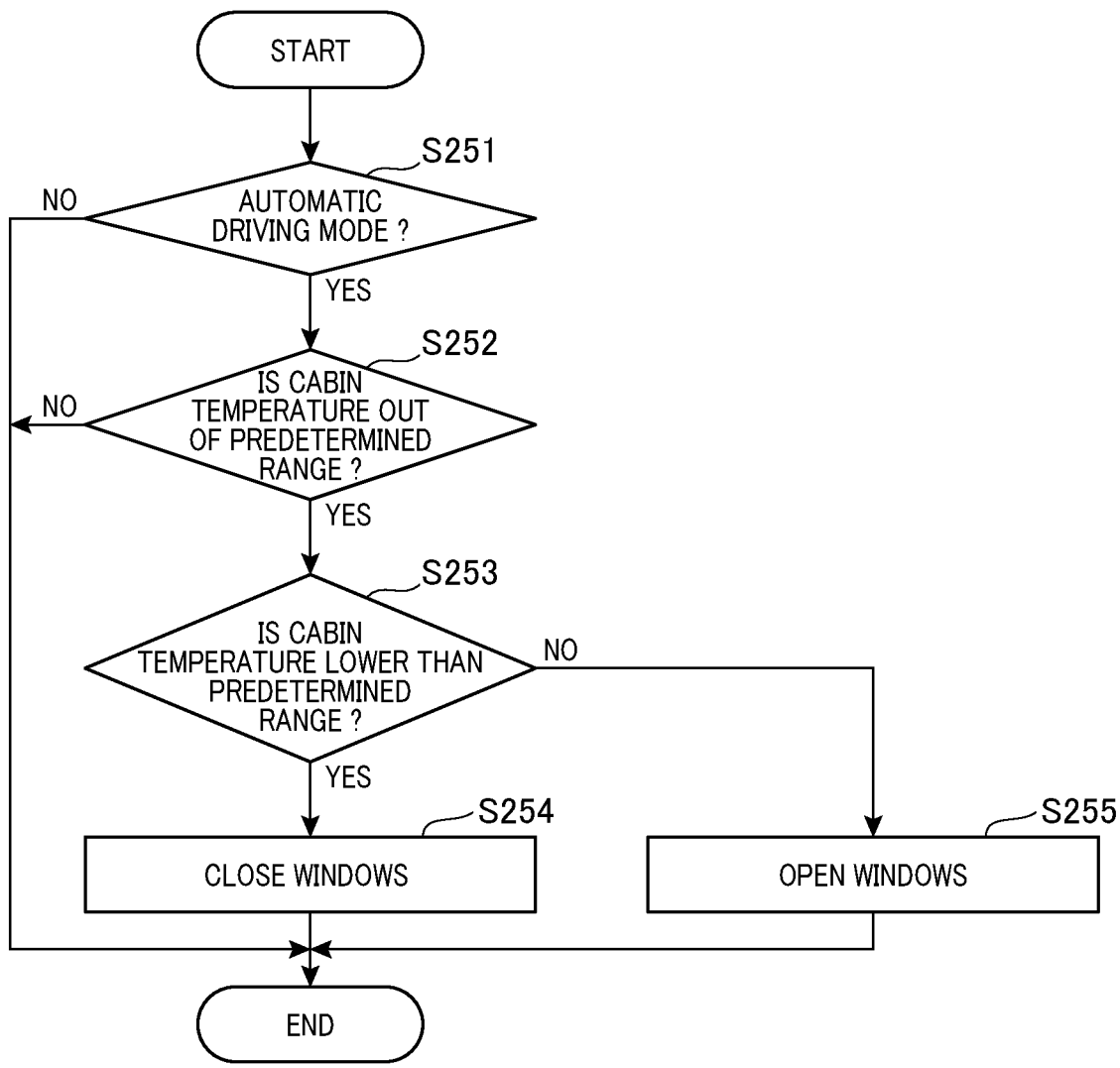
FIG. 6 is a flowchart illustrating an operation of the temperature adjusting ECU.

Subsequently, with reference to FIG. 6, control contents of the temperature adjusting ECU 21 will be described. At step S251, the automatic driving determination unit 211 determines whether the vehicle is in an automatic driving mode or not. When the vehicle is in an automatic driving mode, the process proceeds to step S252, and terminates the procedure when the vehicle is not in an automatic driving mode.

At step S252, the cabin temperature adjusting unit 213 determines whether the temperature in the vehicle cabin is out of the predetermined range. When the temperature in the vehicle cabin is out of the predetermined range, the process proceeds to step S253, and terminates the procedure when the temperature in the vehicle cabin is not out of the predetermined range.

At step S253, the cabin temperature adjusting unit 213 determines whether the temperature in the vehicle cabin is lower than the predetermined range. When the temperature in the vehicle cabin is lower than the predetermined range, the process proceeds to step S254, and proceeds to step S255 when the temperature in the vehicle cabin is not lower than the predetermined range.

At step S254, the cabin temperature adjusting unit 213 commands the window actuator 30 to close the windows. Since the temperature in the vehicle cabin is lower than the predetermined range, the windows are closed to maintain the temperature. At step S255, the cabin temperature adjusting unit 213 commands the window actuator 30 to open the window. However, if the temperature in the vehicle cabin is higher than the predetermined range, the window is opened to lower the temperature in the vehicle cabin.

Figure 7:
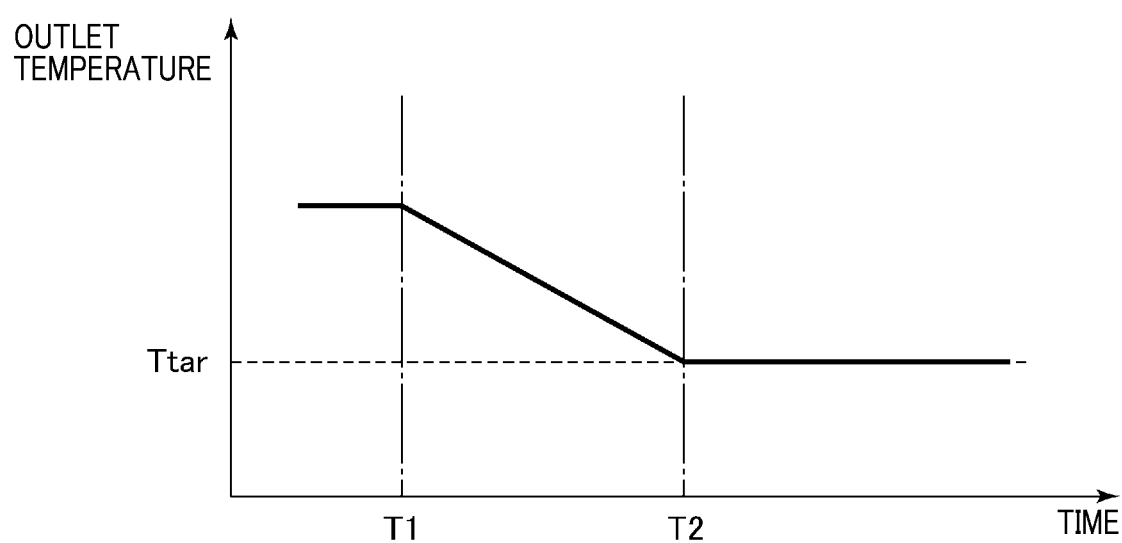
FIG. 7 is a graph for explaining an operation of the temperature adjusting ECU.

When opening the window, the air conditioning apparatus 25 may also be operated. FIG. 7 is an example of a relationship between the outlet temperature and the time, illustrating an example of a decrease in the outlet temperature in the summer. At time T1, the window may preferably be opened with the same timing as the activation of the air conditioning apparatus 25. To achieve the target outlet temperature Ttar, opening of the window and the operation of the air conditioning apparatus 25 are both utilized, whereby the temperature at the outlet can reach the target outlet temperature Ttar faster than a case where the air conditioning apparatus 25 only operates. The outlet target temperature Ttar varies depending on the temperature setting of the air conditioning apparatus 25 such that the lower the temperature setting, the lower the outlet target temperature. After reaching the time T2, the windows may be closed.

Subsequently, with reference to FIG. 8, control contents of the temperature adjusting ECU 21 will be described. At step S301, the automatic driving determination unit 211 determines whether the vehicle is in an automatic driving mode. When the vehicle is in an automatic driving mode, the process proceeds to step S302, and terminates the procedure when the vehicle is not in the automatic driving mode.

At step S302, the cabin temperature adjusting unit 213 determines whether the temperature of the vehicle cabin is out of the predetermined temperature. When the temperature in the vehicle cabin is out of the predetermined range, the process proceeds to step S303, and terminates the procedure when the temperature in the vehicle cabin is not out of the predetermined range. The upper and lower limit of the predetermined range can be changed considering an amount of solar radiation and the humidity.

Figure 10:
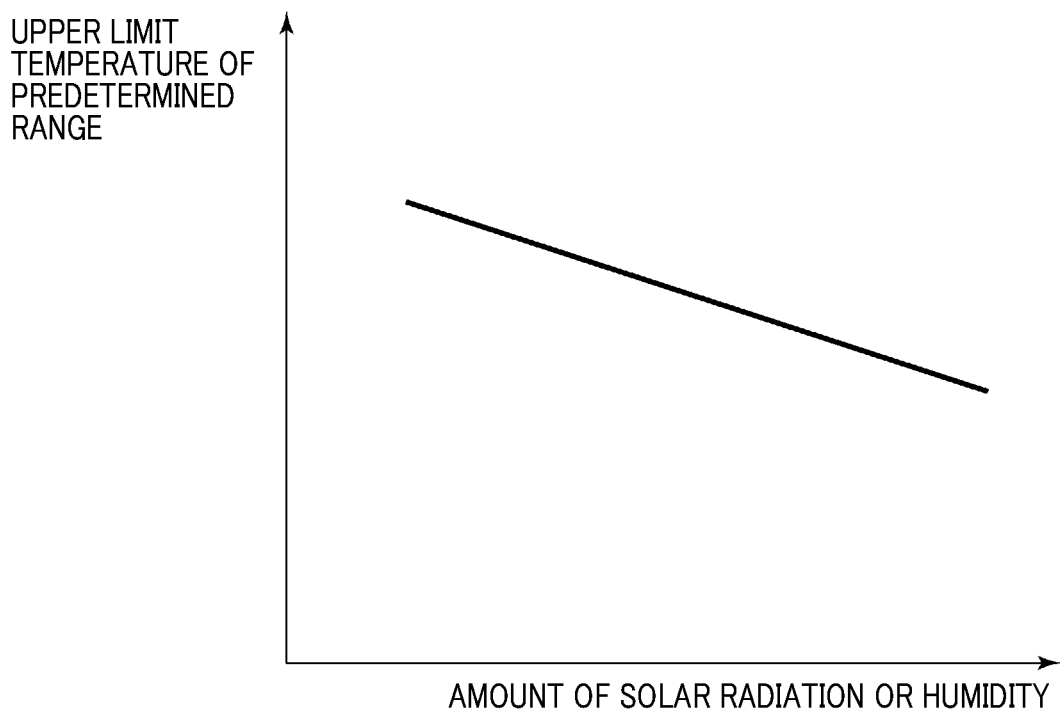
FIG. 10 is a graph for explaining an operation of the temperature adjusting ECU.

As shown in FIG. 10, the upper limit temperature of the predetermined range is lowered depending on an increase/decrease in an amount of solar radiation or humidity. This is because, when the amount of solar radiation or humidity increases or decreases, since the sensible temperature of the passenger increases, it is preferable to restrict the upper limit temperature so as to secure the comfort of the passenger.

Figure 11:
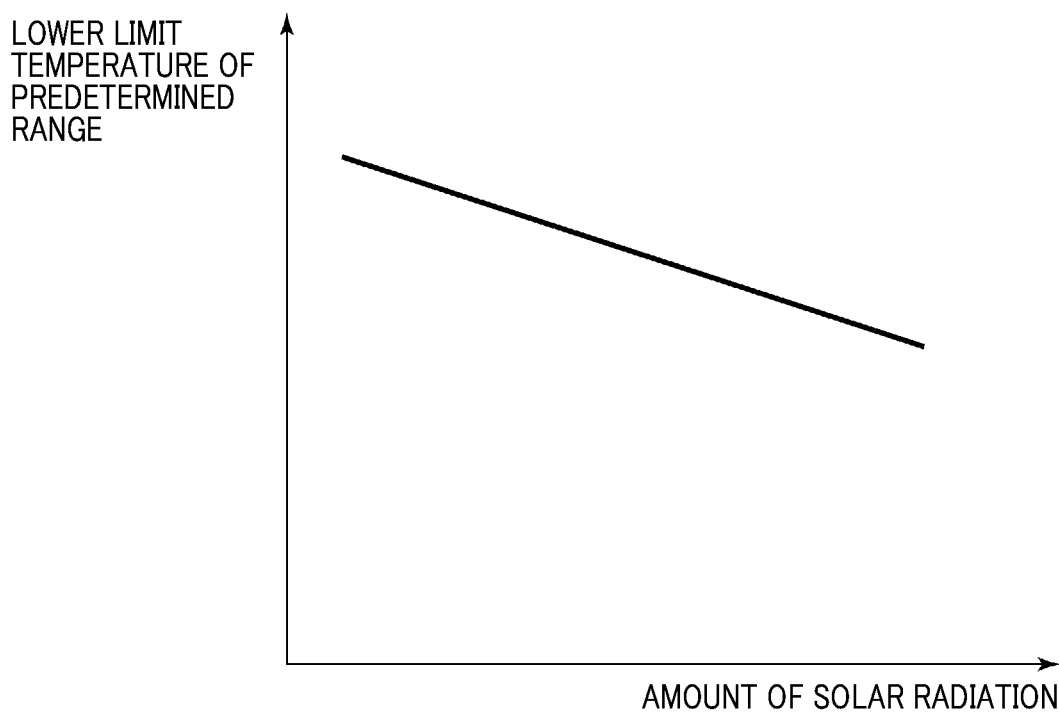
FIG. 11 is a graph for explaining an operation of the temperature adjusting ECU.

As shown in FIG. 11, the lower limit temperature of the predetermined range may be lowered depending on an increase in an amount of solar radiation. When an amount of solar radiation is large in the winter, the sensible temperature of the passenger in the vehicle cabin increases.

Figure 8:
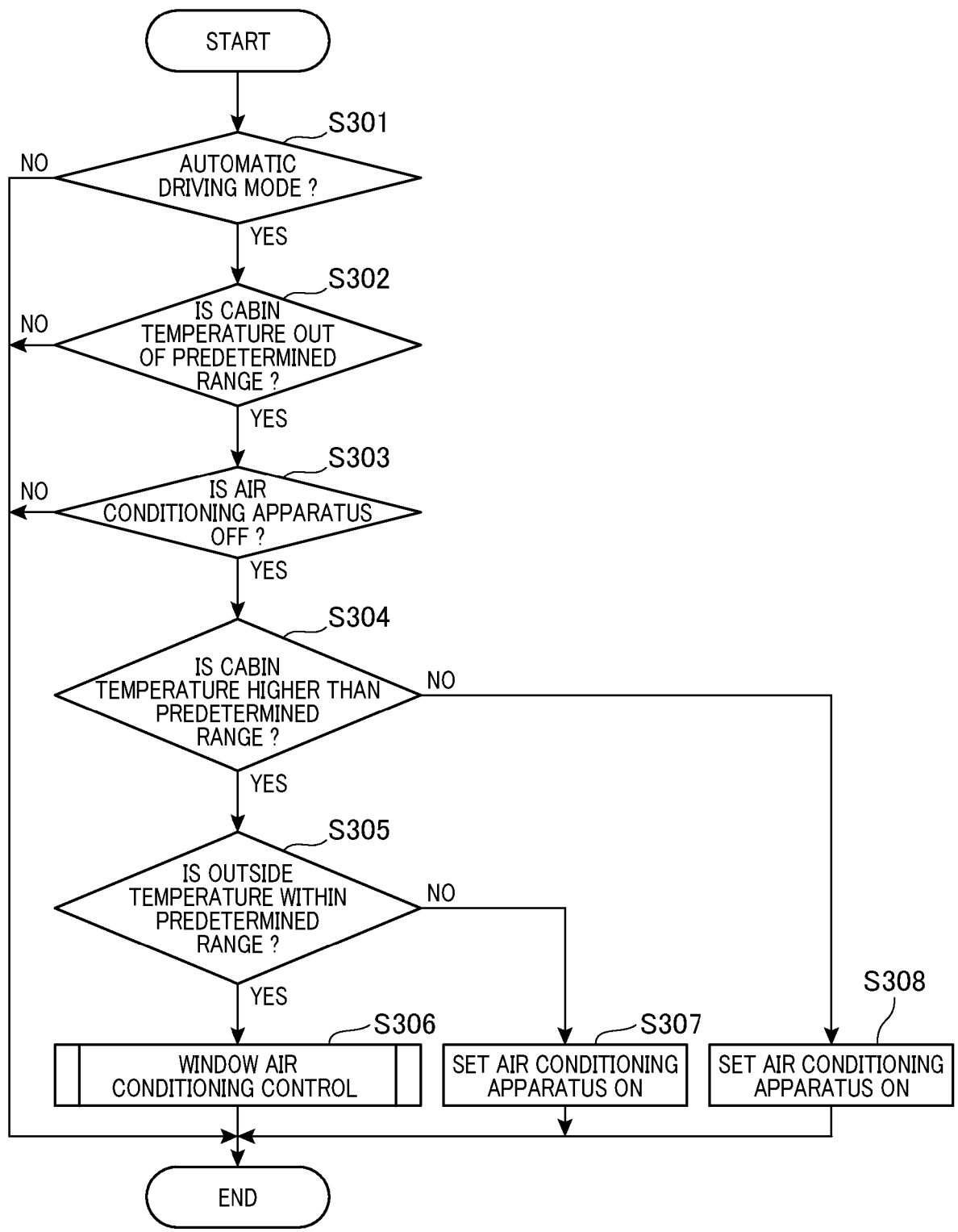
FIG. 8 is a flowchart illustrating an operation of the temperature adjusting ECU.

At step S303 shown in FIG. 8, the cabin temperature adjusting unit 213 determines whether the air conditioning apparatus 25 is OFF. When the air conditioning apparatus 25 is OFF, the process proceeds to step S304, and terminates the procedure when the air conditioning apparatus 25 is ON.

At step S304, the cabin temperature adjusting unit 213 determines whether the temperature in the vehicle cabin is higher than the predetermined range. When the temperature in the vehicle cabin is higher than the predetermined range, the process proceeds to step S305. When the temperature in the vehicle cabin is not higher than the predetermined range, the process proceeds to step S308.

At step S305, the cabin temperature adjusting unit 213 determines whether the temperature in the vehicle cabin is within a predetermined range. When the temperature in the vehicle cabin is within the predetermined range, the process proceeds to step S307.

Figure 9:
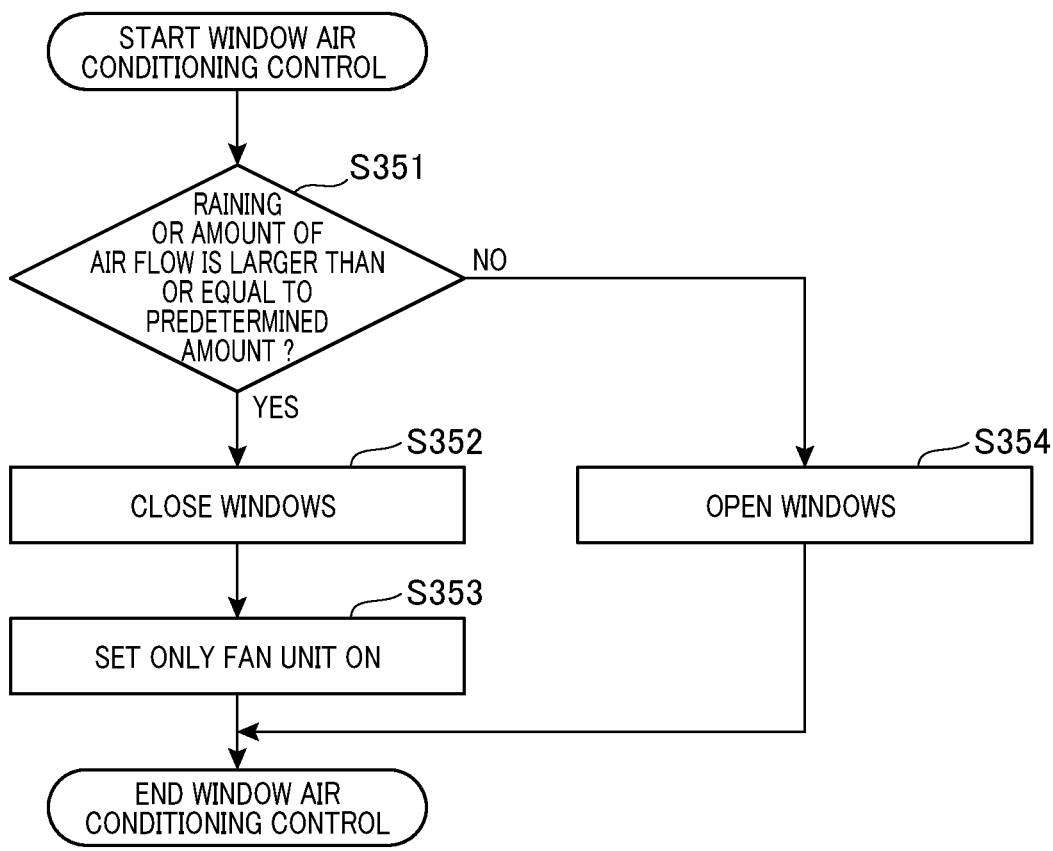
FIG. 9 is a flowchart illustrating an operation of the temperature adjusting ECU.

With reference to FIG. 9, a window air conditioning control process at step S306 will be described. At S351 shown in FIG. 9, the cabin temperature adjusting unit 213 determines whether it is raining around the vehicle, or whether an amount of air flow around the vehicle is larger than or equal to a predetermined amount of air flow. When it is raining around the vehicle, or an amount of air flow around the vehicle is larger than or equal to the predetermined amount of air flow, the process proceeds to step S352. When no rain is detected around the vehicle, or the amount of air flow is not larger than nor equal to the predetermined amount of air flow, the process proceeds to step S354.

At step S352, the cabin temperature adjusting unit 213 commands the window actuator 30 to close the windows, to prevent rain entering into the vehicle cabin, or prevent a strong breeze blowing into the vehicle cabin. At step S353, the cabin temperature adjusting unit 213 drives only the fan unit 251 and introduces outside air into the vehicle cabin.

At step S354, the cabin temperature adjusting unit 213 commands the window actuator 30 to open the windows. When processes at step S353 and step S354 are terminated, the window air conditioning process is terminated.

At step S307, the cabin temperature adjusting unit 213 operates the air conditioning apparatus 25 so as to perform a cooling operation. Specifically, the cabin temperature adjusting unit 213 operates the fan unit 251 and the compressor 252, thereby performing an air conditioning.

At step S308, the cabin temperature adjusting unit 213 operates the air conditioning apparatus 25 so as to perform a heating operation, and operates the seat warming apparatus 31 to be in a heater side. Specifically, the cabin temperature adjusting unit 213 operates the fan unit 251 such that the air blows the heater core to increase the temperature. Also, the cabin temperature adjusting unit 213 supplies power to the seat warming apparatus to increase the temperature.

For a cooling operation and a heating operation, equipment having higher cooling effect and warming effect relative to the power consumption can be preferentially operated. In the case where a driving power supply and an operational power supply of the vehicle are a common battery such as an electric vehicle, an operation is preferably required depending on the remaining energy. For a vehicle having a gasoline engine, when the output power of the engine is used to drive the compressor 252 for example, since the operation of the compressor 252 influences the remaining gasoline as a remaining energy, an operation is preferably required depending on the remaining gasoline as a remaining energy. When the remaining energy is less than or equal to a predetermined amount, the output of the air conditioning apparatus 25 and the seat warming apparatus 31 may preferably be restricted.

As an operation depending on the remaining energy, a temperature adjusting means may selectively be operated. For example, as the remaining energy becomes lower, the temperature adjusting means which directly cools or warms the passenger may be preferentially executed. For example, considering an electric vehicle, when the SOC (state of charge) becomes low, the seat warming apparatus 31 is preferably operated and the air conditioning apparatus 25 is preferably stopped. In a view of energy consumption, depending on a decrease in the remaining energy, operation of an apparatus may be stopped successively to prevent an apparatus consuming a relatively large amount of energy. Thus, the vehicle cabin can be maintained to allow the passenger to feel comfortable for a long period. In the case where an infant is present in the vehicle cabin, in order to prevent the infant from falling out, the priority of selecting opening the window may be low.

Subsequently, with reference to FIG. 12, control contents of the temperature adjusting ECU 21 will be described. At step S401, the automatic driving determination unit 211 determines whether the vehicle is in an automatic driving mode. When the vehicle is in an automatic driving mode, the process proceeds to step S402, and terminates the procedure when the vehicle is not in an automatic driving mode.

At step S402, the cabin temperature adjusting unit 213 determines whether the air conditioning apparatus 25 is ON. When the air conditioning apparatus 25 is ON, the process proceeds to step S403 and terminates the procedure when the air conditioning apparatus 25 is OFF.

At step S403, the passenger detecting unit 214 determines whether the driver is in a state of sleeping. When the driver is in a state of sleeping, the process proceeds to step S404, and terminates the procedure when the driver is not in a state of sleeping.

At step S404, the remaining energy detecting unit 216 determines whether the remaining energy for performing the temperature adjusting in the vehicle cabin is less than or equal to a threshold. When the remaining energy is less than or equal to the threshold, the process proceeds to step S405, and terminates the procedure when the remaining energy is not less than nor equal to the threshold.

At step S405, the destination change unit 217 submits a change of the destination to the navigation unit 103. At step S406 subsequent to step S405, an energy supply process is executed.

Thus, while the vehicle is in an automatic driving operation or after the vehicle arrives the destination, the destination may be automatically changed to a location where a vehicle charging stand and a gas station are present, if the remaining energy is less than the threshold. Hence, regardless of a timing before/after arriving the destination, loss of the energy used for the air conditioning during the automatic driving operation is avoided. As a result, the passengers can be prevented from losing comfort.

Note that the threshold of the remaining energy can be set corresponding to an energy required for driving the vehicle for a distance between the energy supply station and the current location. That is, the threshold of the remaining energy may preferably be set such that the larger the distance to the closest energy supply station, the larger the threshold of the remaining energy is. Therefore, before completely consuming the energy, determination can be made whether the vehicle should proceed to the energy station in a state where the vehicle is able to arrive the energy stand reliably.

In the control shown in FIG. 12, energy exhaustion which would cause a malfunction of the air conditioning function, which would cause the temperature in the vehicle cabin to rapidly increase, is avoided. Note that a confirmation process may be performed to confirm with the passenger whether or not the vehicle should proceed to an energy stand.

As described, with reference to the specific examples, the present embodiment has been described. However, the present disclosure is not limited to those specific examples. As long as apparatuses own features of the present disclosure, the apparatuses to which appropriate design change is applied, based on the specific examples by the person having an ordinary skill in the art applies, are also included in the scope of the present disclosure. Each of the elements, arrangement, conditions and shapes in the above-described specific examples are not limited to those exemplified in the specific examples, but can be appropriately modified. Combinations of the respective elements included in the above-described examples may be appropriately changed without any technical inconsistency.

As an automatic driving technique of adapting for a travel environment, for example, a technique has been disclosed. In the technique, while an intervention operation such as accelerator operation, braking operation or steering operation by the driver is performed during an automatic driving operation, a target value for a driving force, a braking force and a steering angle are determined based on the intervention operation, and any one of the travelling speed, the intervehicle distance, the acceleration factor, the travelling line and the like is detected. Then, the control parameter set in advance including the traveling speed, the intervehicle distance, the acceleration factor and the travelling line is corrected so as to minimize a deviation relative to the values detected when the intervention operation is performed.

However, according to techniques in the related art including the above-mentioned patent literature, an automatic driving technique focusing on driving of the vehicle is only disclosed and no technique focusing on higher comfort is disclosed. In a vehicle where one passenger drives the vehicle, at least the driver is able to adjust the temperature if the temperature in the vehicle cabin varies, based on the temperature sensed by the driver.

However, in the case where a vehicle is capable of performing automatic driving, and the vehicle is in the automatic driving mode, it is expected that passengers cannot appropriately adjust the temperature setting because of various reasons such as that all passengers may be sleeping, or a passenger suddenly falls ill, or all of the passengers are children.

The present disclosure provides a temperature adjusting apparatus capable of securing comfort of passenger, even when the temperature setting in the vehicle cabin cannot be operated by the passenger during automatic driving of the vehicle.

The present disclosure provides a temperature adjusting apparatus provided in a vehicle capable of performing automatic driving.

The temperature adjusting apparatus includes: an automatic driving determination unit that determines whether or not an automatic driving control is operating in the vehicle; a cabin temperature acquiring unit that acquires a cabin temperature in a vehicle cabin of the vehicle; and a cabin temperature adjusting unit that adjusts the cabin temperature.

The cabin temperature adjusting unit is configured to control, when the automatic driving determination unit determines that the automatic driving control is operating in the vehicle and the cabin temperature acquired by the cabin temperature acquiring unit exceeds a predetermined range, temperature adjusting means provided in the vehicle, thereby executing a temperature adjusting control to adjust the cabin temperature.

According to the present disclosure, when the automatic driving control is executing in the vehicle capable of performing automatic driving and the temperature in the vehicle cabin exceeds a predetermined range, the temperature in the vehicle cabin can be adjusted. Hence, even in a case of an automatic-driving specific situation where the automatic driving control is executing and a passenger is unable to adjust the temperature in the vehicle cabin because the passenger is sleeping for example, passenger's comfort can be ensured.

According to the present disclosure, even when the passenger is unable to perform a temperature setting in the vehicle cabin during automatic driving of the vehicle, passenger's comfort can be ensured.

What is claimed is:

1. A temperature adjusting apparatus provided in a vehicle capable of performing automatic driving, the apparatus comprising:
a processor configured to:
    determine whether an automatic driving control is operating in the vehicle;
    acquire a cabin temperature in a vehicle cabin of the vehicle;
    acquire environment information around the vehicle, and estimate a temperature trend in the vehicle cabin based on the acquired environment information, the acquired environment information including (i) a temperature, (ii) a humidity, (iii) an amount of solar radiation, (iv) an amount of air flow, (v) an amount of rainfall, (vi) a season, and (viii) predicted values of at least one of the temperature, the humidity, the amount of solar radiation, the amount of air flow, the amount of rainfall, and the season;
    adjust the cabin temperature by:
        when (i) the automatic driving control is determined to be operating in the vehicle and (ii) the acquired cabin temperature exceeds a predetermined range, controlling a temperature adjusting means provided in the vehicle to execute a temperature adjusting control to adjust the cabin temperature;
        controlling a plurality of types of temperature adjusting means, including the temperature adjusting means, based on the environment information to execute the temperature adjusting control;
        performing the temperature adjusting control in accordance with a preset value based on a degree of discomfort or a user setting value;
        executing the temperature adjusting control based on the estimated temperature trend in the vehicle cabin; and
        executing the temperature adjusting control by opening or closing at least one window of the vehicle based on at least the environment information around the vehicle;
    detect remaining energy to drive the temperature adjusting means of the plurality of types of temperature adjusting means; and
    change a destination of the vehicle to be a location where energy is configured to be supplied to the vehicle, when the detected remaining energy is less than or equal to a threshold and when all passengers in the vehicle cabin are children when the automatic driving control is operating in the vehicle.

2. The temperature adjusting apparatus according to claim 1, wherein the processor is configured to control an air conditioning apparatus provided in the vehicle to execute the temperature adjusting control.

3. The temperature adjusting apparatus according to claim 2, wherein the processor is configured to change a state of the air conditioning apparatus to be in an activation state from a stop state, or to be in the stop state from the activation state, to respectively execute or stop the temperature adjusting control.

4. The temperature adjusting apparatus according to claim 1, wherein the predetermined range is determined by the preset value based on the degree of discomfort or the user setting value.

5. The temperature adjusting apparatus according to claim 1, wherein the processor is configured to:
    detect whether at least one passenger is present in the vehicle; and
    execute the temperature adjusting control when the at least one passenger is detected as present in the vehicle.

6. The temperature adjusting apparatus according to claim 1, wherein the processor is configured to execute the temperature adjusting control by acquiring air outside the vehicle.

7. The temperature adjusting apparatus according to claim 1, wherein the processor is configured to:
    restrict an output of the temperature adjusting means of the plurality of types of temperature adjusting means when the detected remaining energy is less than or equal to the threshold.

8. The temperature adjusting apparatus according to claim 1, wherein when one of the passengers in the vehicle is an infant, the processor is configured to execute the temperature adjusting control by opening and closing the at least one window with a lower priority than a priority assigned to at least one other temperature adjusting means of the plurality of types of temperature adjusting means.

* * * * *